United States Patent
Iba

(10) Patent No.: US 8,828,742 B2
(45) Date of Patent: Sep. 9, 2014

(54) METHOD OF MANUFACTURING MAGNETORESISTIVE EFFECT ELEMENT THAT INCLUDES FORMING INSULATIVE SIDEWALL METAL OXIDE LAYER BY SPUTTERING PARTICLES OF METAL MATERIAL FROM PATTERNED METAL LAYER

(75) Inventor: Yoshihisa Iba, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 338 days.

(21) Appl. No.: 13/290,779

(22) Filed: Nov. 7, 2011

(65) Prior Publication Data

US 2012/0139019 A1    Jun. 7, 2012

(30) Foreign Application Priority Data

Dec. 2, 2010    (JP) ................................. 2010-269249

(51) Int. Cl.
  *H01L 21/473*    (2006.01)
  *H01L 43/12*    (2006.01)
  *H01L 43/08*    (2006.01)
  *H01L 27/22*    (2006.01)

(52) U.S. Cl.
  CPC .............. *H01L 27/228* (2013.01); *H01L 43/12* (2013.01); *H01L 43/08* (2013.01)
  USPC .................................. 438/3; 438/695; 438/696

(58) Field of Classification Search
  USPC .................................................. 257/E27.006
  See application file for complete search history.

(56) References Cited

U.S. PATENT DOCUMENTS

| | | | |
|---|---|---|---|
| 6,624,987 B1 * | 9/2003 | Hayashi et al. ............. | 360/324.2 |
| 7,829,963 B2 * | 11/2010 | Wang et al. .................... | 257/421 |
| 7,936,027 B2 * | 5/2011 | Xiao et al. ..................... | 257/421 |
| 7,948,044 B2 * | 5/2011 | Horng et al. .................. | 257/421 |
| 2001/0024347 A1 | 9/2001 | Shimazawa et al. | |

FOREIGN PATENT DOCUMENTS

JP    2001-196659    7/2001

* cited by examiner

*Primary Examiner* — Stephen W Smoot
(74) *Attorney, Agent, or Firm* — Fujitsu Patent Center

(57) ABSTRACT

A method of manufacturing a magnetoresistive effect element includes forming a first electrode above a substrate, forming a metal layer of a metal material above the first electrode, forming a first magnetic layer above the metal layer, forming a tunnel insulating film above the first magnetic layer, forming a second magnetic layer above the tunnel insulating film, forming a second electrode layer above the second magnetic layer, patterning the second electrode layer, patterning the second magnetic layer, the tunnel insulating film, the first magnetic layer and the metal layer, while depositing sputtered particles of the metal film on side walls of the second magnetic layer, the tunnel insulating film, the first magnetic layer and the metal layer to form a sidewall metal layer, and oxidizing the sidewall metal layer to form an insulative sidewall metal oxide layer.

9 Claims, 22 Drawing Sheets

METHOD OF MANUFACTURING MAGNETORESISTIVE EFFECT ELEMENT THAT INCLUDES FORMING INSULATIVE SIDEWALL METAL OXIDE LAYER BY SPUTTERING PARTICLES OF METAL MATERIAL FROM PATTERNED METAL LAYER

CROSS REFERENCE TO RELATED APPLICATIONS

This application is based upon and claims the benefit of priority of the prior Japanese Patent Application No. 2010-269249, filed on Dec. 2, 2010, the entire contents of which are incorporated herein by reference.

FIELD

The embodiments discussed herein are related to a magnetoresistive effect element and a method of manufacturing a magnetoresistive effect element.

BACKGROUND

Recently, as a rewritable nonvolatile memory, the magnetic random access memory (hereinafter called the MRAM) including magnetoresistive effect elements arranged in a matrix is noted. The MRAM uses combinations of magnetization directions of two magnetic layers to memorize information and detects resistance changes (i.e., current changes or voltage changes) between when the magnetization directions of the magnetic layers are parallel to each and when they are antiparallel to each other to read the memorized information.

As one of the magnetoresistive effect elements forming the MRAM is known the magnetic tunnel junction (hereinafter called the MTJ) element is known. The MTJ element includes two ferromagnetic layers stacked with a tunnel insulating film formed therebetween and uses the phenomenon that different tunnel currents flow between the magnetic layers via the tunnel insulating film, based on relationships of the magnetization directions of the two ferromagnetic layers. That is, the MTJ element has a lower element resistance when the magnetization directions of the two ferromagnetic layers are parallel to each other, and when they are antiparallel to each other, has a higher element resistance. Such two states are related with data "0" and data "1", whereby the MTJ element can be used as a memory element.

The following is example of related: Japanese Laid-open Patent Publication No. 2001-196659.

To improve the reliability of magnetic memory devices and other electronic devices using magnetoresistive effect elements, structures which can improve the reliability of the magnetoresistive effect elements and manufacturing method which can stably manufacture the magnetoresistive effect elements of high reliability are expected.

SUMMARY

According to one aspect of an embodiment, there is provided a method of manufacturing a magnetoresistive effect element including forming a first electrode above a substrate, forming a metal layer of a metal material above the first electrode, forming a first magnetic layer above the metal layer, forming a tunnel insulating film above the first magnetic layer, forming a second magnetic layer above the tunnel insulating film, forming a second electrode layer above the second magnetic layer, patterning the second electrode layer, patterning the second magnetic layer, the tunnel insulating film, the first magnetic layer and the metal layer, while depositing sputtered particles of the metal film on side walls of the second magnetic layer, the tunnel insulating film, the first magnetic layer and the metal layer to form a sidewall metal layer, and oxidizing the sidewall metal layer to form an insulative sidewall metal oxide layer.

According to another aspect of an embodiment, there is provided a magnetoresistive effect element including a first electrode formed above a substrate, a metal layer formed of a metal material above the first electrode, a first magnetic layer formed above the metal layer, a tunnel insulating film formed above the first magnetic layer, a second magnetic layer formed above the tunnel insulating film, and an insulative sidewall metal oxide layer formed on side walls of the metal layer, the first magnetic layer, the tunnel insulating film and the second magnetic layer and formed of a oxide of the metal material.

According to further another aspect of an embodiment, there is provided a magnetic memory device including a select transistor formed above a substrate, and a magnetoresistive effect element including a first electrode formed above the substrate and connected to the select transistor, a metal layer formed above the first electrode and formed of a metal material, a first magnetic layer formed above the metal layer, a tunnel insulating film formed above the first magnetic layer, a second magnetic layer formed above the tunnel insulating film, a second electrode formed above the second magnetic layer, and an insulative sidewall metal oxide layer formed on sidewalls of the metal layer, the first magnetic layer, the tunnel insulating film and the second magnetic layer and formed on the oxide of the metal material.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A magnetic memory device and a method of manufacturing the magnetic memory device according to an embodiment will be described with reference to FIGS. 1 to 21B.

Figure 1:
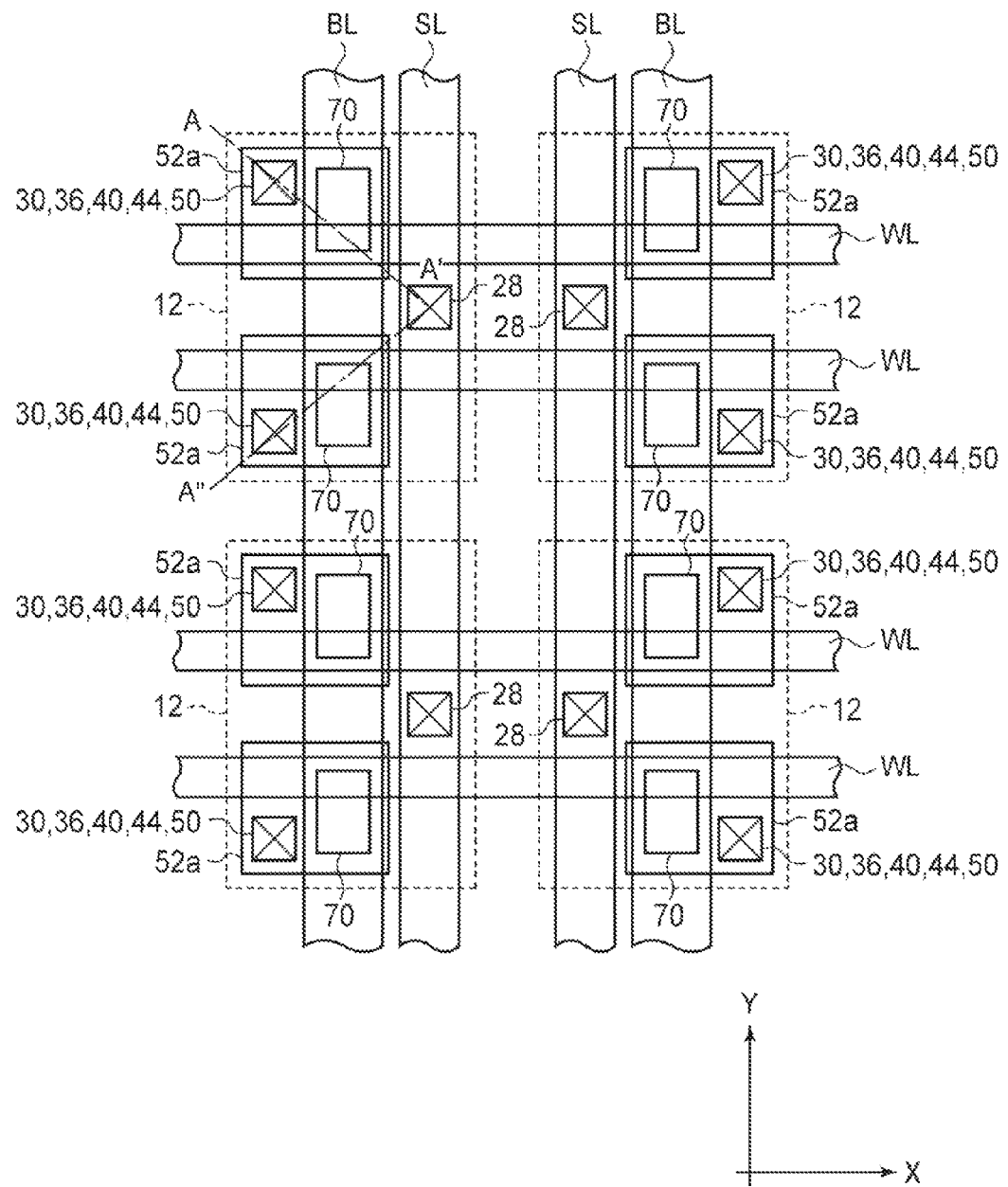
FIG. 1 is a plan view illustrating a structure of a magnetic memory device according to an embodiment.
Figure 2:
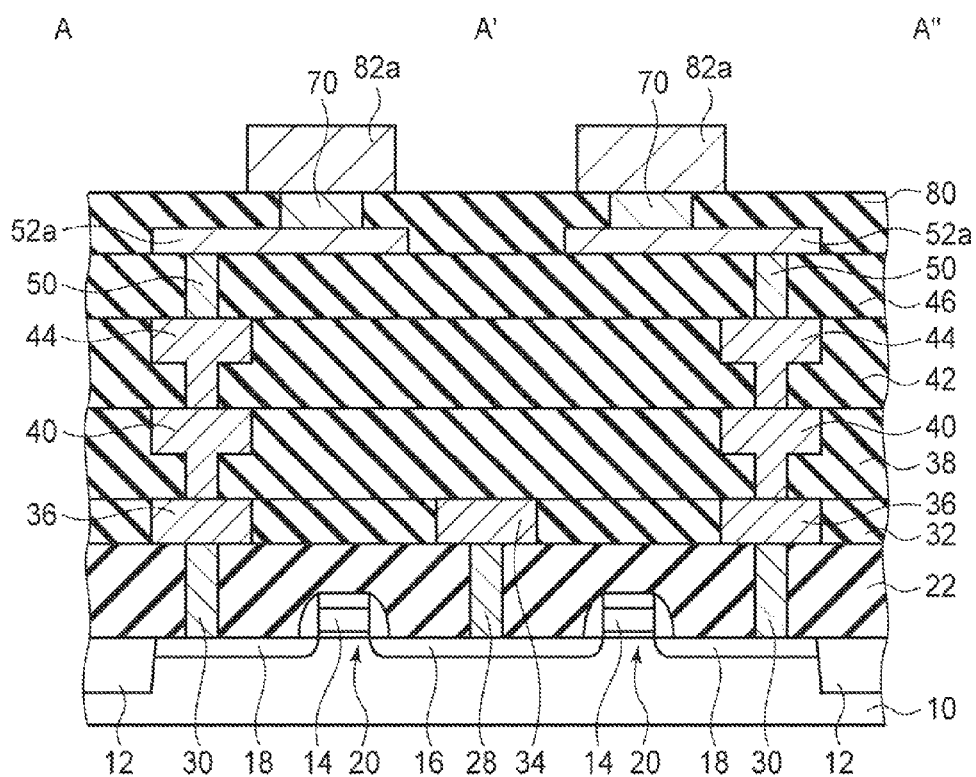
FIG. 2 is a diagrammatic sectional view illustrating the structure of the magnetic memory device according to the embodiment.
Figure 3:
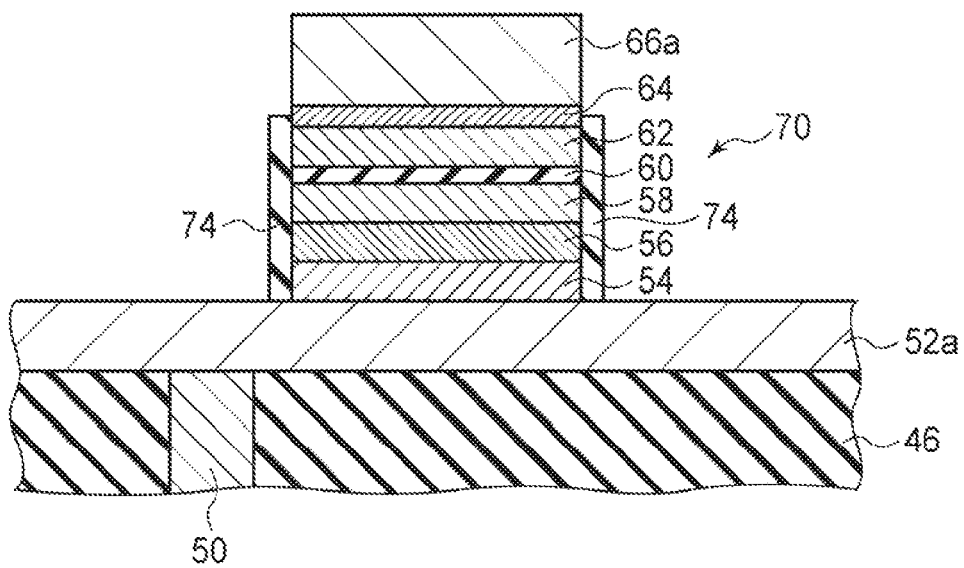
FIG. 3 is a diagrammatic sectional view illustrating a structure of a magnetoresistive effect element used in the magnetic memory device according to the embodiment.

FIG. 1 is a plan view illustrating the structure of the magnetic memory device according to the present embodiment. FIG. 2 is a diagrammatic sectional view illustrating the structure of the magnetic memory device according to the present embodiment. FIG. 3 is a diagrammatic sectional view illustrating a structure of a magnetoresistive effect element used in the magnetic memory device according to the present embodiment. FIGS. 4 to 20B are sectional views illustrating a method of manufacturing the magnetic memory device according to the present embodiment. FIGS. 21A and 21B are sectional views illustrating a method of manufacturing a magnetic memory device according to a reference example.

First, the structure of the magnetic memory device according to the present embodiment will be described with reference to FIGS. 1 to 3. FIG. 2 is the diagrammatic sectional view along the A-A'-A" line in FIG. 1. FIG. 3 is an enlarged sectional view of the magnetoresistive effect element.

A device isolation insulating film 12 for defining active regions is formed in a silicon substrate 10. In the active regions, select transistors 20 each including a gate electrode 14, and a source region 16 and a drain region 14 formed in the silicon substrate 10 on both sides of the gate electrode 14 are formed. In each active region, two select transistors 20 commonly including one source region 16 are formed. The gate electrodes 14 of the select transistors 20 of the memory cells arranged in the X direction are connected to each other, forming word lines WL extended in the X direction.

Above the silicon substrate 10 with the select transistors 20 formed on, an inter-layer insulating film is formed. In the inter-layer insulating film 22, contact plugs 28 connected to the source regions 16, and contact plugs 30 connected to the drain regions are buried.

Above the inter-layer insulating film 22 with the contact plugs 28, 30 buried in, an inter-layer insulating film 36 is formed. In the inter-layer insulating film 36, source lines 34 connected to the source regions 16 via the contact plugs 28, and relay interconnections 36 connected to the drain regions 18 via the contact plugs 30 are formed. As illustrated in FIG. 1, the source lines (SL) 34 are formed, extended in the Y direction and connected to the source regions 16 of the memory cells arranged in the Y direction.

Above the inter-layer insulating film 32 with the source lines 34 and the relay interconnections 36 buried in, an inter-layer insulating film 38 is formed. In the inter-layer insulating film 38, relay interconnections 40 connected to the drain regions 18 via the relay interconnections 36 and the contact plugs 30 are buried in.

Above the inter-layer insulating film 38 with the relay interconnections 40 buried in, an inter-layer insulating film 42 is formed. In the inter-layer insulating film 42, relay interconnections 44 connected to the drain regions 18 via the relay interconnections 40, 36 and the contact plugs 30 are buried in.

Above the inter-layer insulating film 42 with the relay interconnections 44 buried in, an inter-layer insulating film 46 is formed. In the inter-layer insulating film 46, contact plugs 50 connected to the drain regions 18 via the relay interconnections 44, 40, 36 and the contact plugs 30 are buried in.

Above the inter-layer insulating film 46 with the contact plugs 50 buried in, lower electrodes 52a connected to the drain regions 18 via the contact plugs 50, the relay interconnections 44, 40, 36 and the contact plugs 30 are formed. Above the lower electrodes 52a, magnetoresistive effect elements 70 are formed.

Above the inter-layer insulating film 36 with the lower electrodes 52a and the magnetoresistive effect elements 70 formed on, an inter-layer insulating film 80 which is flush with the upper surfaces of the magnetoresistive effect elements 70 is formed. Above the inter-layer insulating film 80, bit lines 82a connected to the upper electrodes (not illustrated) of the magnetoresistive effect elements 70 are formed. As illustrated in FIG. 1, the bit lines (BL) 82a are formed, extended in the Y direction and are connected to the magnetoresistive effect elements 70 of the memory cells arranged in the Y direction.

Thus, Above the silicon substrate 10, the magnetic memory device including the memory cells arranged in a matrix, which each include one select transistor 20 and one magnetoresistive effect element 70 is formed.

As illustrated in FIG. 3, the magnetoresistive effect element 70 includes a metal layer 54, an antiferromagnetic layer 56, a ferromagnetic layer 58, a tunnel insulating film 60, a ferromagnetic layer 62 and a cap layer 64 sequentially stacked above the lower electrode 52a. Thus, the magnetoresistive effect element 70 of the present embodiment is an MTJ (magnetic tunnel junction) element including the ferromagnetic layer 54 as a pinned magnetization layer having the magnetization direction pinned by the antiferromagnetic layer 56 and the ferromagnetic layer 62 as a free magnetization layer stacked with the tunnel insulating film 60 formed therebetween.

Above the side walls of the magnetoresistive effect element 70, a sidewall metal oxide layer 74 which is an insulator is formed. The sidewall metal oxide layer 70 is formed of an oxide of a metal material forming the metal layer 54. The sidewall metal oxide layer 70 functions as the protection film for preventing the magnetoresistive effect element 70 from being damaged in the wet cleaning process following the patterning of the magnetoresistive effect element 70.

As described above, the magnetic memory device according to the present embodiment includes the metal layer 54 between the lower electrode 52a and the antiferromagnetic layer 56 of the magnetoresistive effect element 70. The metal layer 54 is patterned together with the magnetoresistive effect element 70 and is absent above the lower electrode 52a except the region where the magnetoresistive effect element 70 is formed. Above the side walls of the magnetoresistive effect element 70, the sidewall metal oxide layer 74 formed of an oxide of a metal material forming the metal layer 54 is provided.

Next, the method of manufacturing the magnetic memory device according to the present embodiment will be described with reference to FIGS. 4 to 20B. FIGS. 4 to 13 are sectional views of the magnetic memory device along the A-A'-A" line in FIG. 1, and FIGS. 14A to 20B are enlarged sectional views of the part where the magnetoresistive effect element is formed.

First, the device isolation insulating film 12 is formed on the surface of the silicon substrate 10 of, e.g., a p-type substrate by, e.g., STI (Shallow Trench Isolation) method.

Figure 4:
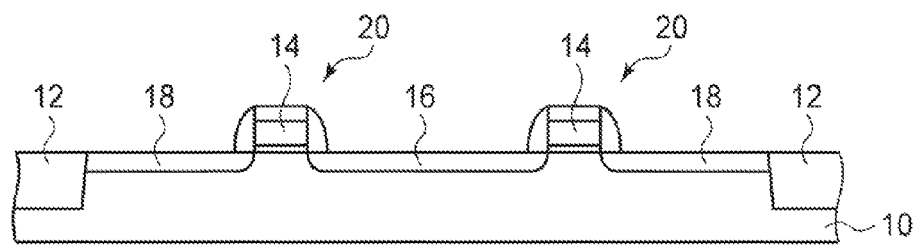
FIGS. 4-13, 14A, 14B, 15A, 15B, 16A, 16B, 17A, 17B, 18A, 18B, 19A, 19B, 20A and 20B are sectional views illustrating a method of manufacturing the magnetic memory device according to the embodiment.

Then, in each active region defined by the device isolation insulating film 12, the select transistors 20 each including the gate electrode 14, the source region 16 and the drain region 18 formed in the silicon substrate 10 on both sides of the gate electrode are formed in the same ways as in the usual MIS transistor manufacturing method (FIG. 4). In each active region, two select transistors 20 commonly including the source region 16 are formed here.

Then, above the silicon substrate 10 with the select transistors 20 formed on, a silicon oxide film, for example, is deposited by, e.g., CVD method, and the surface of the silicon oxide film is planarized by, e.g., CMP method to form the inter-layer insulating film 22 having the surface planarized.

Then, the contact holes 24 and the contact holes are formed in the inter-layer insulating film 22 respectively down to the source region 16 and down to the drain regions 18 by photolithography and dry etching.

Figure 5:
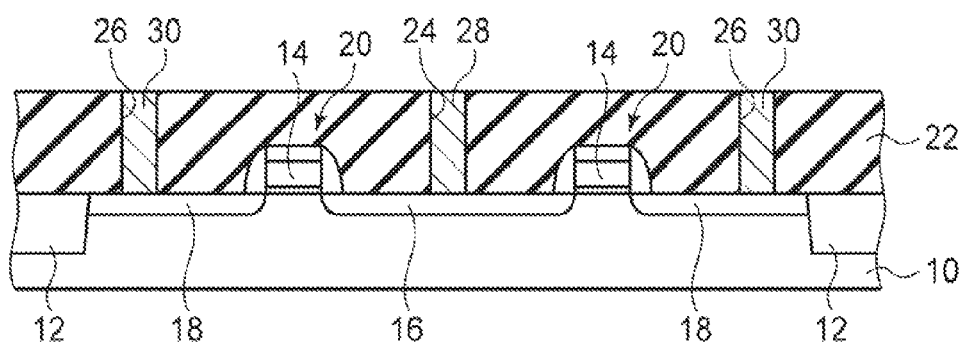

Then, a barrier metal of, e.g., titanium nitride or others, and a tungsten film are deposited above the entire surface, and then these conductive films above the inter-layer insulating film 22 are etched back or polished back to form the contact plugs 28, 30 buried in the contact holes 24, 26 (FIG. 5).

Next, above the inter-layer insulating film 22 with the contact plugs 28, 30 buried in, a silicon nitride film and a silicon oxide film 38, for example, are sequentially formed by, e.g., CVD method. Thus, the inter-layer insulating film 32 of the $SiO_2$/SiN structure is formed.

Figure 6:
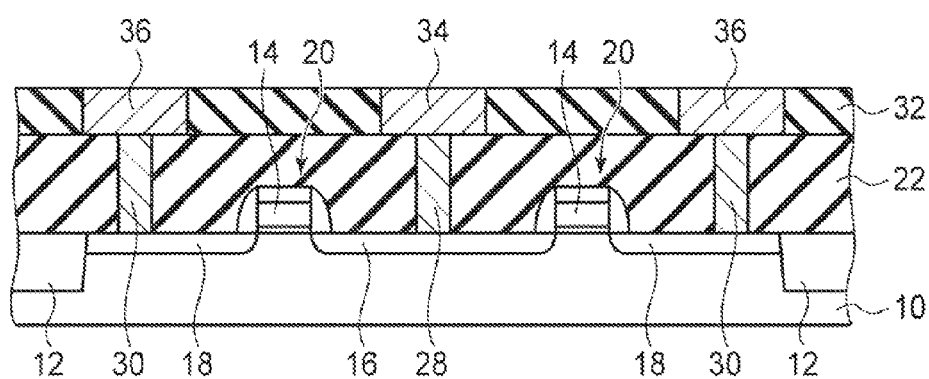

Then, copper interconnections buried in the inter-layer insulating film 32 are formed by single damascene method. As the copper interconnections buried in the inter-layer insulating film 32, the source lines connected to the source regions 16 via the contact plugs 28, and the relay interconnections 36 connected to the drain regions 18 via the contact plugs 30 are formed here (FIG. 6).

Next, above the inter-layer insulating film 32 with the source lines 34 and the relay interconnections 36 buried in, a silicon nitride film, a silicon oxide film and silicon nitride film are sequentially formed by, e.g., CVD method to form the inter-layer insulating film 38 of the SiN/$SiO_2$/SiN structure.

Then, the copper interconnections buried in the inter-layer insulating film 38 are formed by dual damascene method. As the copper interconnections buried in the inter-layer insulating film 38, the relay interconnections 40 connected to the drain regions 18 via the relay interconnections 36 and the contact plugs 30 are formed here (FIG. 7).

Figure 7:
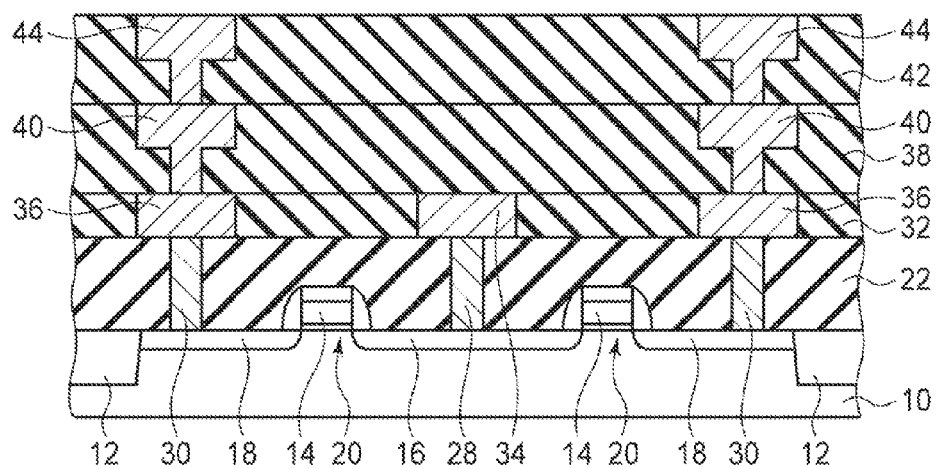

In the same way, above the inter-layer insulating film 38 with the relay interconnections 40 buried in, the inter-layer insulating film 42 with the relay interconnections 44 buried in, which are connected to the drain regions 18 via the relay interconnections 40, 36 and the contact plugs 30 (FIG. 7).

Next, above the inter-layer insulating film 42 with the relay interconnections 44 buried in, a silicon carbide film and a silicon oxide film, for example, are sequentially formed by, e.g., CVD method. Thus, the inter-layer insulating film 46 of the $SiO_2$/SiC structure is formed.

Then, the contact holes 48 down to the relay interconnections 44 are formed in the inter-layer insulating film 46 by photolithography and dry etching.

Figure 8:
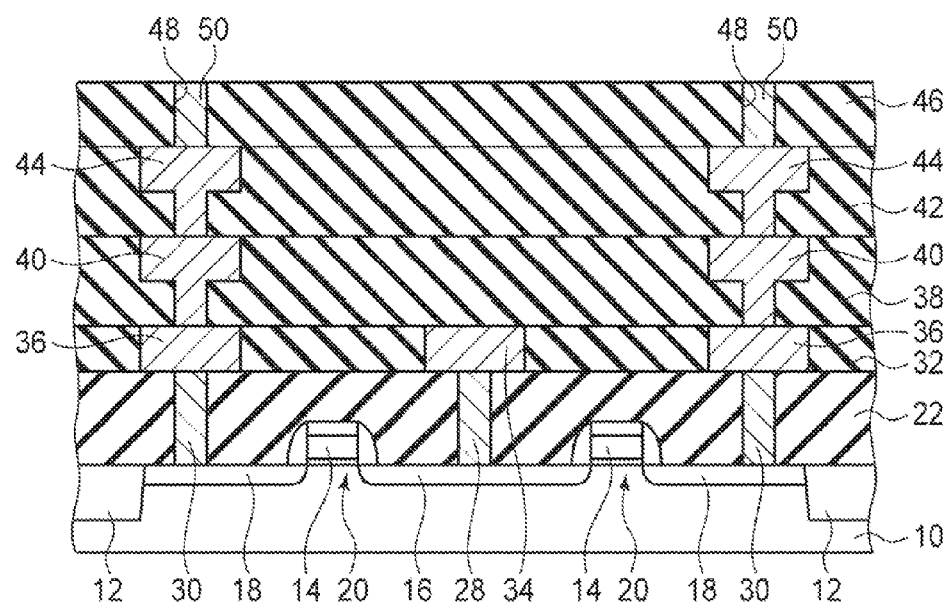

Then, a barrier metal of, e.g., titanium nitride, and a tungsten film are deposited above the entire surface, and these conductive films above the inter-layer insulating film 46 are etched back or polished back to form the contact plugs 50 buried in the contact holes 48 (FIG. 8).

In the specification of the present application, for the convenience of the description, not only the semiconductor substrate itself but also the part below the inter-layer insulating film 46 including the inter-layer insulating film 46 are often expressed collectively by "the substrate".

Then, above the inter-layer insulating film 46 with the contact plugs 50 buried in, the lower electrode layer 52 is formed by, e.g., sputtering method.

The lower electrode layer 52 is formed preferably of a low resistance material having good adhesion to the inter-layer insulating film 46. Such material can be, e.g., Ta (tantalum), W (tungsten), Hf (hafnium) or others. The film thickness of the lower electrode layer 52 can be about 20 nm-50 nm.

The lower electrode layer 52 of a tantalum film of, e.g., a 30 nm-thickness is formed here.

Figure 14A:
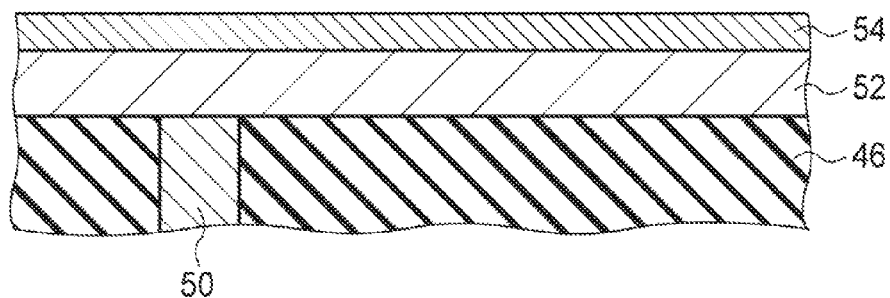

Next, above the lower electrode layer 52, the metal layer 54 is formed by, e.g., sputtering method (FIG. 14A).

The metal layer 54 is formed of a metal material whose oxide is an insulator. Especially, an oxide insulator having resistance to the wet processing is preferable. Preferably, the material forming the metal layer 54 is a metal material having a high etching rate to the constituent material of the lower electrode layer 52 and the upper electrode layer 66 to be formed later. Preferably, the metal material forming the metal layer 54 is a low resistance metal material having good adhesion to the lower electrode layer 52. Such metal material can be a light metal of, e.g., Al (aluminum), Ti (titanium), Zr (zirconium), V (vanadium) Cr (chrome), Cu (copper) or others. The film thickness of the metal layer 54 can be about 10 nm-30 nm.

The metal layer 54 of an Al film of, e.g., a 15 nm-thickness is formed here.

Figure 14B:
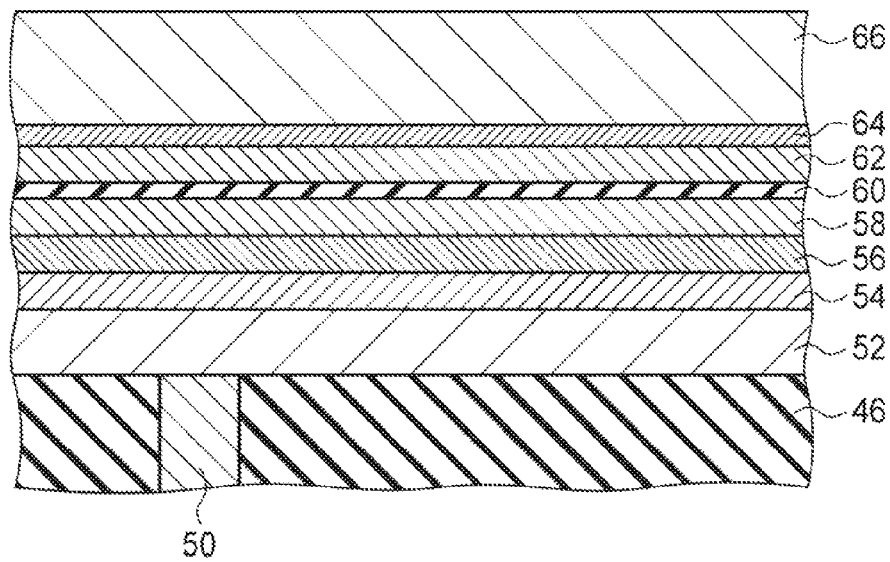

Next, above the metal layer 54, the antiferromagnetic layer 56, the ferromagnetic layer 58, the tunnel insulating film 60, the ferromagnetic layer 62, the cap layer 64, the upper electrode layer 66 are sequentially formed by, e.g., sputtering method (FIG. 14B).

The antiferromagnetic layer 56 is not especially limited and can be, e.g., a 15 nm-thickness PtMn film. The ferromagnetic layer 58 is not especially limited and can be, e.g., a 3 nm-thickness CoFeB film. The tunnel insulating film 60 is not especially limited and can be, e.g., a 1 nm-thickness MgO film. The ferromagnetic layer is not especially limited and can be, e.g., a 2 nm-thickness CoFeB film. The cap layer 64 is not especially limited and can be, e.g., a 3 nm-thickness Ru (ruthenium) film. The upper electrode layer 66 is not especially limited and can be, e.g., a 30 nm-100 nm-thickness, e.g., a 60 nm-thickness Ta film.

Next, thermal processing is made in vacuum, applying parallel magnetic field in the Y direction to magnetize the ferromagnetic layers 58, 62 in a direction parallel to the Y direction. The thermal processing temperature can be, e.g., 350° C.

Figure 15A:
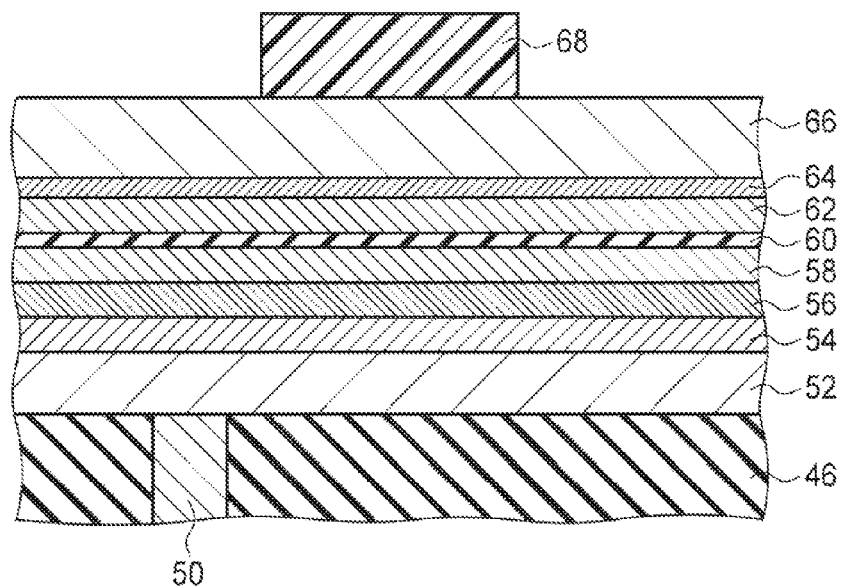

Then, above the upper electrode layer 66, a photoresist film 68 having the pattern covering the magnetoresistive effect element forming region is formed by, e.g., photolithography using ArF excimer laser (FIG. 15A). The film thickness of the photoresist film 68 is not especially limited and can be, e.g., 200 nm. The shape of the magnetoresistive effect element forming region is not especially limited and can have a rectangular shape of, e.g., 50 nm×150 nm elongated in the extending direction of the bit line BL.

Figure 15B:
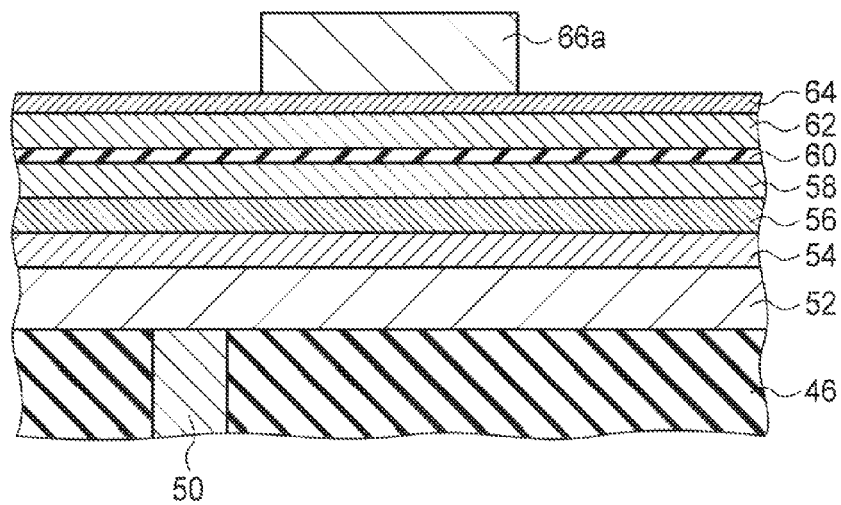

Next, with the photoresist film 68 as the mask and with the cap layer 64 as the etching stopper, the upper electrode layer 66 is patterned by dry etching to form the upper electrode 66a (FIG. 15B). The etching conditions can be, e.g., $CF_4$ and $CHF_3$ as the etching gas, a 50 sccm-flow rate of the $CF_4$ gas, a 100 sccm-flow rate of the $CHF_3$, a 500 W power and a 5 Pa processing chamber internal pressure.

Figure 9:
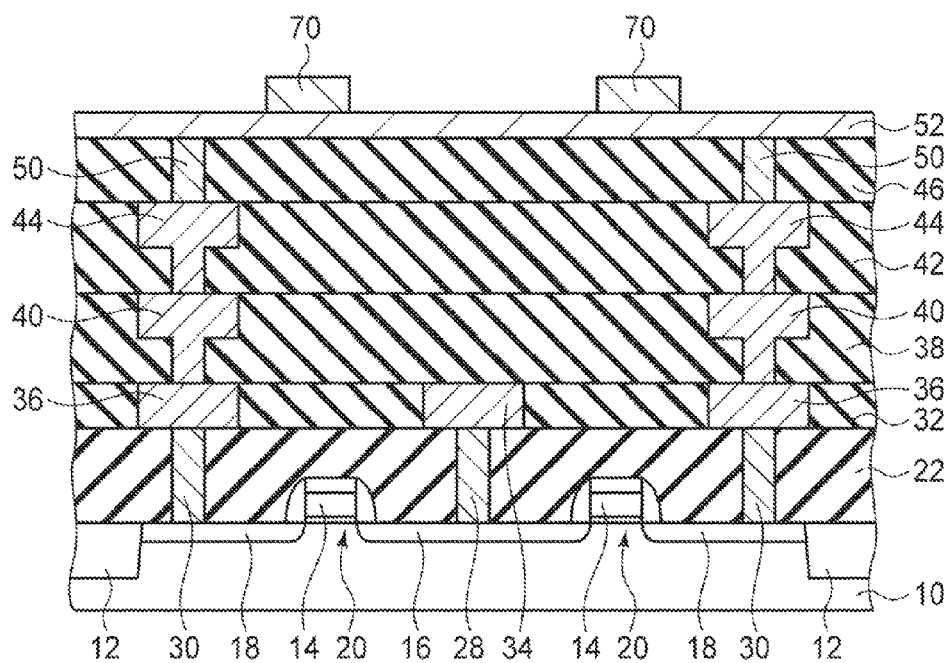
Figure 16A:
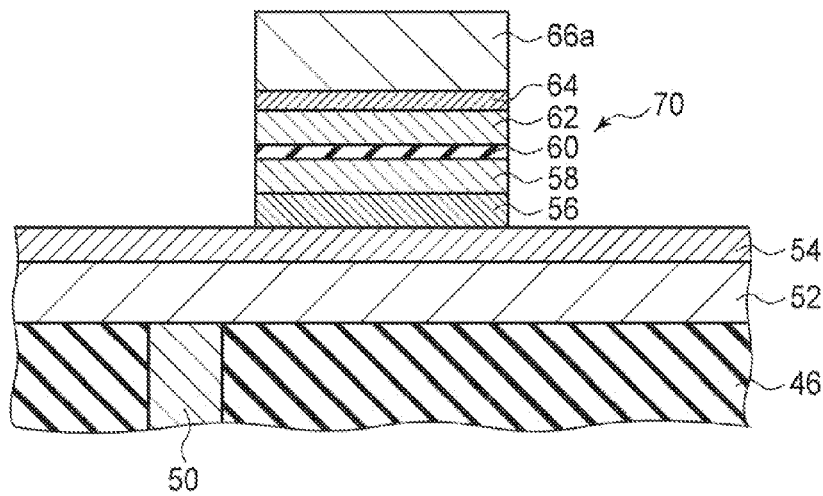

Then, dry etching is made with the upper electrode 66a as the hard mask, the cap layer 64, the ferromagnetic layer 62, the tunnel insulating film 60, the ferromagnetic layer 58 and the antiferromagnetic layer 56 are patterned to form the magnetoresistive effect element 70 (FIG. 16A, FIG. 9). The etching conditions can be, e.g., $CH_3OH$ as the etching gas, a 50 sccm-flow rate of the $CH_3OH$ gas, a 500 W power and a 2 Pa processing chamber internal pressure.

Figure 16B:
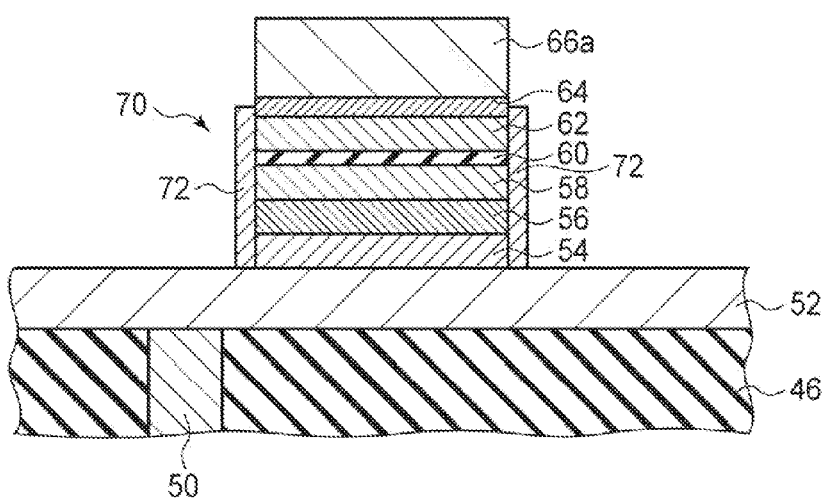

Then, dry etching is further made with the upper electrode 66a as the hard mask to pattern the metal layer 64. In this etching, the sidewall metal layer 72 is formed on the side walls of the layer structure of the upper electrode 66a, the cap layer 64, the ferromagnetic layer 62, the tunnel insulating film 60, ferromagnetic layer 58, the antiferromagnetic layer 56 and the metal layer 54 (FIG. 16B). The sidewall metal layer 72 is formed of the constituent material of the metal layer 54 sputtered on the side walls in etching the metal layer 54.

For the etching of the metal layer 54, preferably, etching conditions which allow the metal layer 54 to be etched selectively to the lower electrode layer 52 are used. In the above-described example, where the lower electrode layer 52 is formed of Ta film, and the metal layer 54 is formed of Al, the selective etching can be made with the etching as, e.g., $CH_3OH$, $NH_3/CO$, HCOH, HCOOH or others.

Specifically, for example, the etching conditions can be, e.g., $CH_3OH$ and Ar as the etching gas, a 50 sccm-flow rate of the $CH_3OH$, a 50 sccm-flow rate of the Ar, a 500 W-power and a 10 Pa-processing chamber internal pressure. The etching rate ratio of the lower electrode layer 52 to the metal layer 54 at this time is about 0.1.

In the studies of the inventor of the present application, the etching selective ratio of the metal layer 54 to the lower electrode layer 52 was about 3-12 when $CH_3OC$ (+Ar) was used as the etching gas; about 3-10 when $NH_3/CO$ (+Ar) was used; about 3-10 when HCOH (+Ar) was used; and about 3-10 when HCOOH (+Ar) was used. The etching selectivity was about 1-2 when Ar was used as the etching gas. When $CF_4$ was used, the etching selective ratio was about 0.5-2. When $Cl_2$ was used, the etching selective ratio was about 1-2.

The high etching selectivity is preferable, because the etching of the metal layer 54 can be well controlled to stop at the interface between the metal layer 54 and the lower electrode layer 52, and the sidewall metal layer 72 to be formed on the side walls of the magnetoresistive effect element 70 can be formed a uniform film thickness in the wafer plane. The film thickness of the metal layer 72 can be controlled by the film thickness of the metal layer 54. The film thickness of the metal layer is so set that the sidewall metal layer 72 is deposited on the side walls of at least the ferromagnetic layer 62, the tunnel insulating film 60, the ferromagnetic layer 58, the antiferromagnetic layer 56, the metal layer 54, so as to be covered the side wall of the tunnel insulating film 60 with the sputtered particles.

As means of increasing the etching selectivity, it is considered that the combination of the constituent material of the metal layer 54 and the constituent material of the lower electrode layer 52, which raises the etching selective ratio, is selected, and the etching conditions are so set that the etching selective ratio is raised. It is also considered that the etching selective ratio is raised by both the combination of the constituent materials and the etching conditions.

In the case that the wafer in-plane uniformity of the etching rate of the metal layer 54 is sufficiently high, it is not essentially necessary to etch the metal layer 54 selectively to the lower electrode layer 52.

Figure 17A:
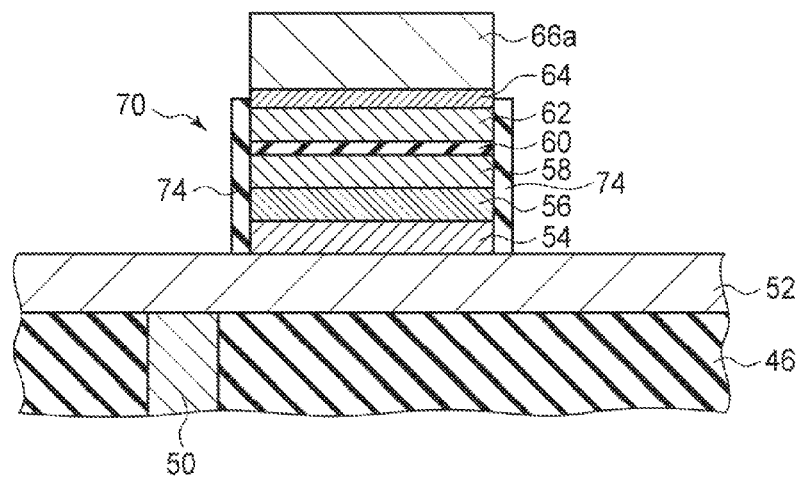

Then, processing is made in an atmosphere containing oxygen to oxidize the sidewall metal layer 72 to form the sidewall metal oxide layer 74 (FIG. 17A).

The sidewall metal layer 72 formed by the sputtering of the metal layer 54, which is formed of a metal material whose oxide is an insulator, is also formed of the metal material whose oxide is an insulator. Accordingly, the sidewall metal layer 72 is oxidized to be substituted by the sidewall metal oxide layer 74, which is an insulator. For example, when the metal layer 54 is formed of Al, the sidewall metal oxide layer 74 is formed of aluminum oxide (e.g., $Al_2O_3$), which is chemically stable.

The film thickness of the sidewall metal layer is uniform in the wafer plane, which can reduce the fluctuations of the oxidation conditions in the wafer plane which are necessary to completely substitute the sidewall metal layer 72 by the sidewall metal oxide layer 74. Thus, the sidewall metal oxide layer 74 can be surely formed in the entire surface of the wafer. The film thickness of the formed sidewall metal oxide layer 74 can be uniform in the wafer plane.

The processing in an atmosphere containing oxygen can be the processing with plasma containing oxygen, e.g., $O_2$, $CO_2$, or others. The plasma processing, which allows the processing at low temperatures, is preferable in that the sidewall metal oxide layer 74 can be formed without degrading the characteristics of the magnetoresistive effect element. The plasma processing with plasmas of $O_2$, $CO_2$ or others diluted with an addition gas ($N_2$, Ar, CO, $CO_2$ or others) may be formed. For example, the etching conditions can be, e.g., the oxygen plasma processing of $O_2$ gas, a 50 sccm-$O_2$ flow rate, a 300 W-power and a 1 Pa-processing chamber internal pressure. Otherwise, the etching conditions can be, e.g., the oxygen plasma processing of $O_2$ gas and $N_2$ gas, a 10 sccm-$O_2$ flow rate, a 100 sccm-$N_2$ flow rate, a 300 W-power and a 2 Pa-processing chamber internal pressure. Otherwise, the etching conditions can be, e.g., the oxygen plasma processing of $O_2$ gas and CO gas, a 10 sccm-$O_2$ flow rate, a 100 sccm-CO flow rate, a 300 W-power and a 2 Pa-processing chamber internal pressure. Otherwise, the etching conditions can be, e.g., the oxygen plasma of $CO_2$ gas, a 100 sccm-$CO_2$ flow rate, a 300 W-power and a 1 Pa-processing chamber internal pressure.

To precisely control the oxidation rate of the sidewall metal layer 72, it is preferable to set the gas pressure of the plasma at not more than 1.0 Torr, preferably not more than 10 mTorr (1 Torr is 133.3 Pa). The reduced pressure atmosphere is made, whereby the oxygen radical quantity in the plasma is decreased, and the oxidation rate can be suppressed.

Next, wet cleaning processing is made to remove the etching residues, etc. The wet cleaning processing can be the wet processing using a chemical solution, e.g., $H_2SO_4$, $HNO_3$, HCl, $NH_4OH$ or others, or a mixed chemical liquid of them and $H_2O_2$.

In the case that the constituent material of the sidewall metal layer 72 has resistance to the chemical solution of the wet cleaning processing, the wet cleaning processing may be made before the sidewall metal layer 72 is oxidized to form the sidewall metal oxide layer 74.

In the wet cleaning processing, the magnetoresistive effect element 70, which has the side wall covered by the sidewall metal layer 72 or the sidewall metal oxide layer 74, can be prevented from being degraded. The sidewall metal layer 72 and the sidewall metal oxide layer 74 having high in-pane film thickness uniformity can be subjected to the wet processing without being damaged at local parts of the wafer.

Figure 17B:
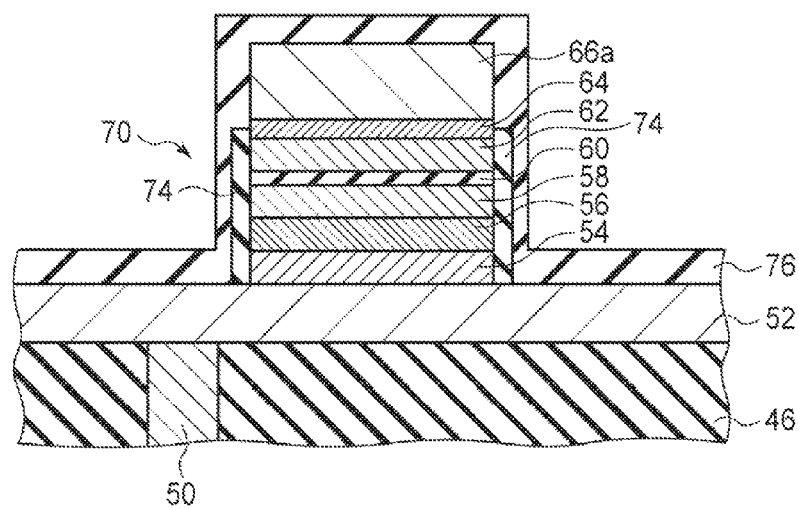

Then, a silicon nitride film of, e.g., a 30 nm-thickness is deposited by, e.g., CVD method above the entire surface to form the barrier insulating film 76 of silicon nitride film (FIG. 17B).

Figure 18A:
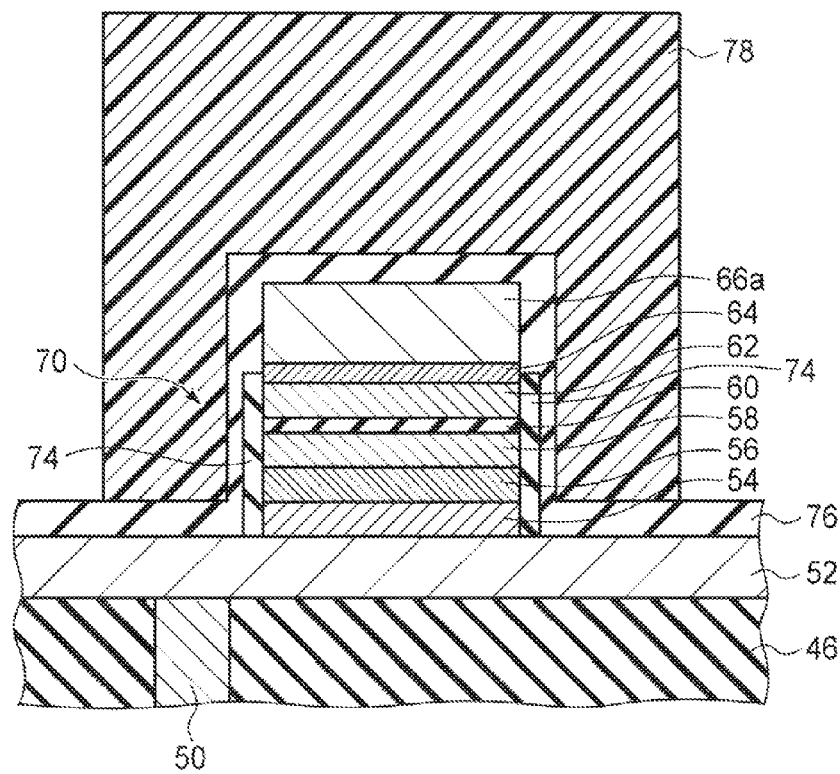

Then, above the barrier insulating film 76, a photoresist film 78 having the pattern covering the lower electrode forming region is formed by, e.g., photolithography using ArF excimer laser (FIG. 18A). The lower electrode forming region is not especially limited and can have a rectangular shape of, e.g., a 200 nm×250 nm size.

Next, dry etching is made with the photoresist film 78 as the mask to pattern the barrier insulating film 76 and the lower electrode layer 52 to form the lower electrode 52a. The etching conditions can be, e.g., $Cl_2$ and $BCl_3$ as the etching gas, 20 sccm-flow rate of the $Cl_2$ gas, 100 sccm-flow rate of the $BCl_3$, 500 W-power, and 10 Pa-processing chamber internal pressure.

Figure 10:
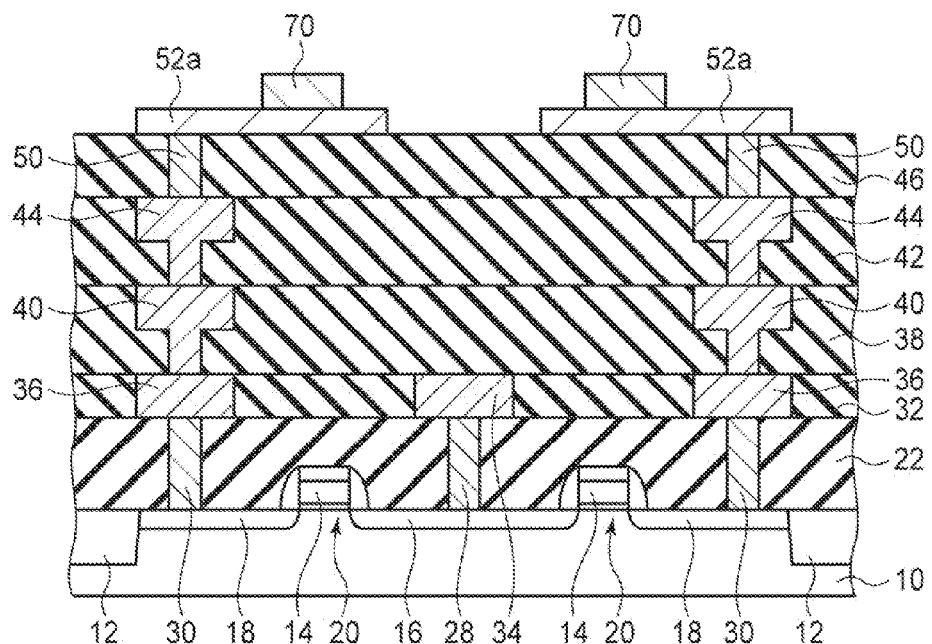
Figure 18B:
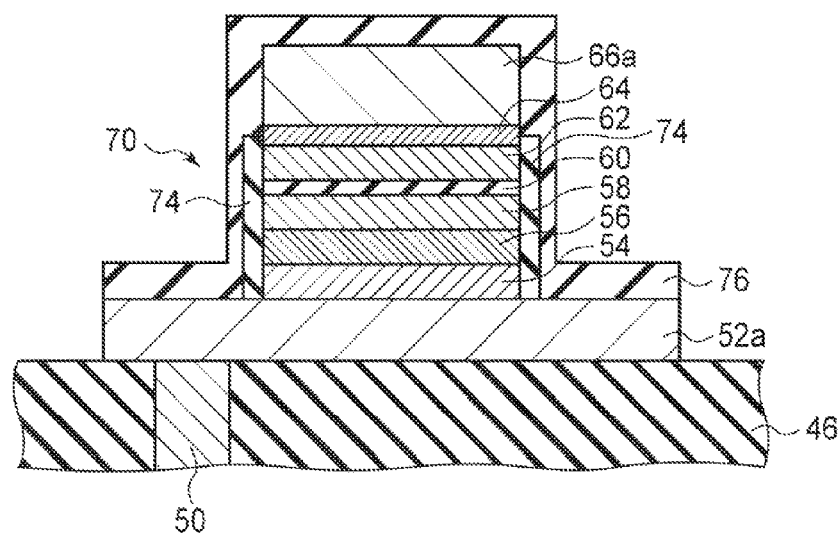

Next, the photoresist film 78 is removed by, e.g., asking method (FIG. 18B, FIG. 10).

Figure 11:
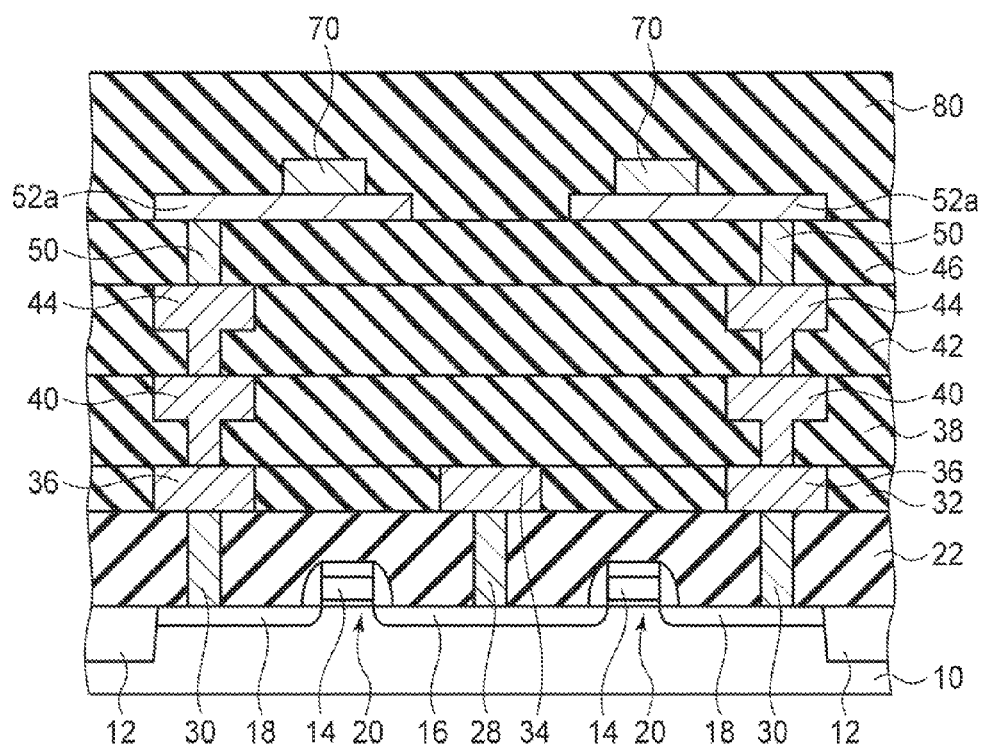
Figure 19A:
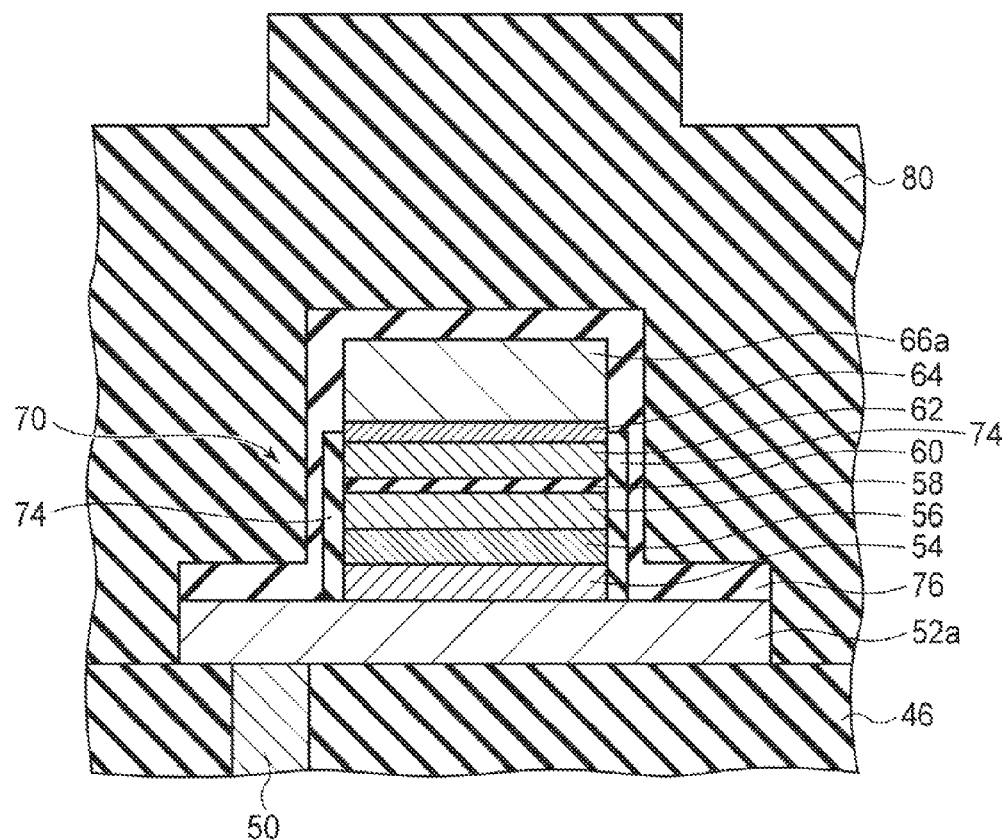

Next, a silicon oxide film of, e.g., a 600 nm-thickness is deposited above the entire surface by, e.g., CVD method to form the inter-layer insulating film 80 of the silicon oxide film (FIG. 19A, FIG. 11).

Figure 12:
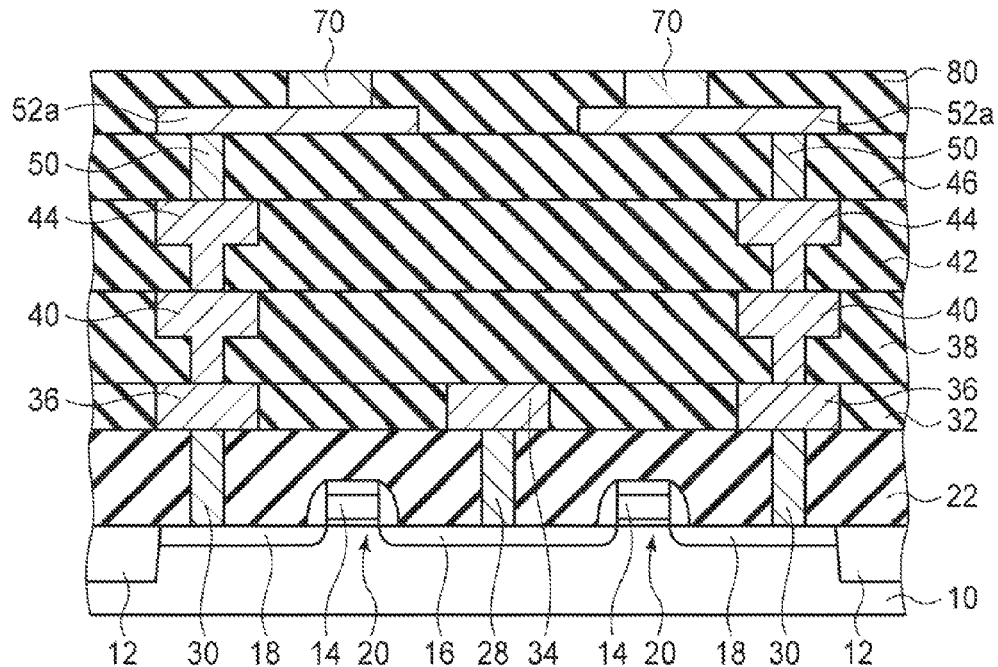
Figure 19B:
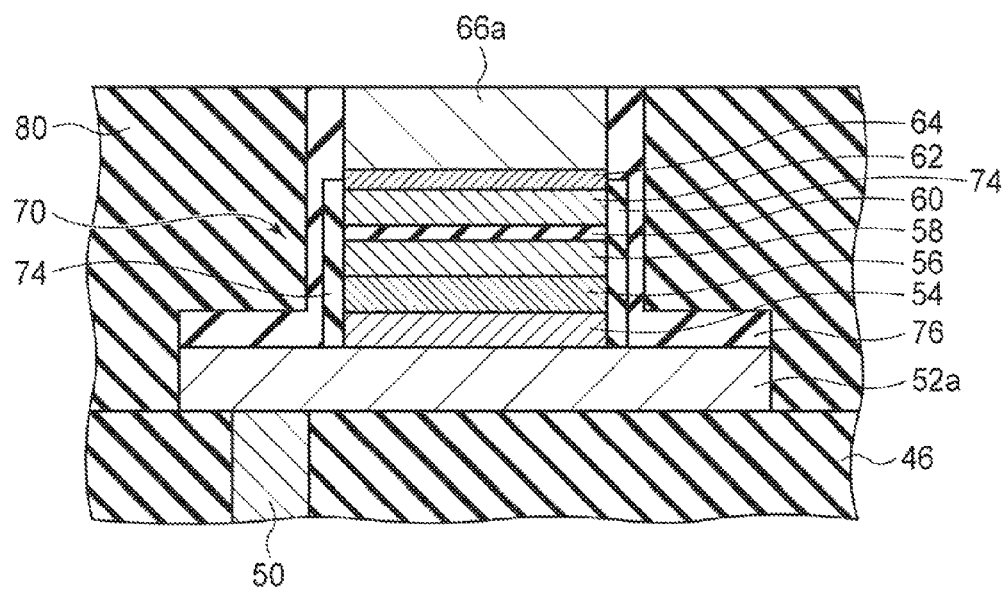

Next, the inter-layer insulating film 80 is polished by, e.g., CMP method to expose the upper surface of the upper electrode 66a while planarizing the inter-layer insulating film 80 (FIG. 19B, FIG. 12).

Figure 20A:
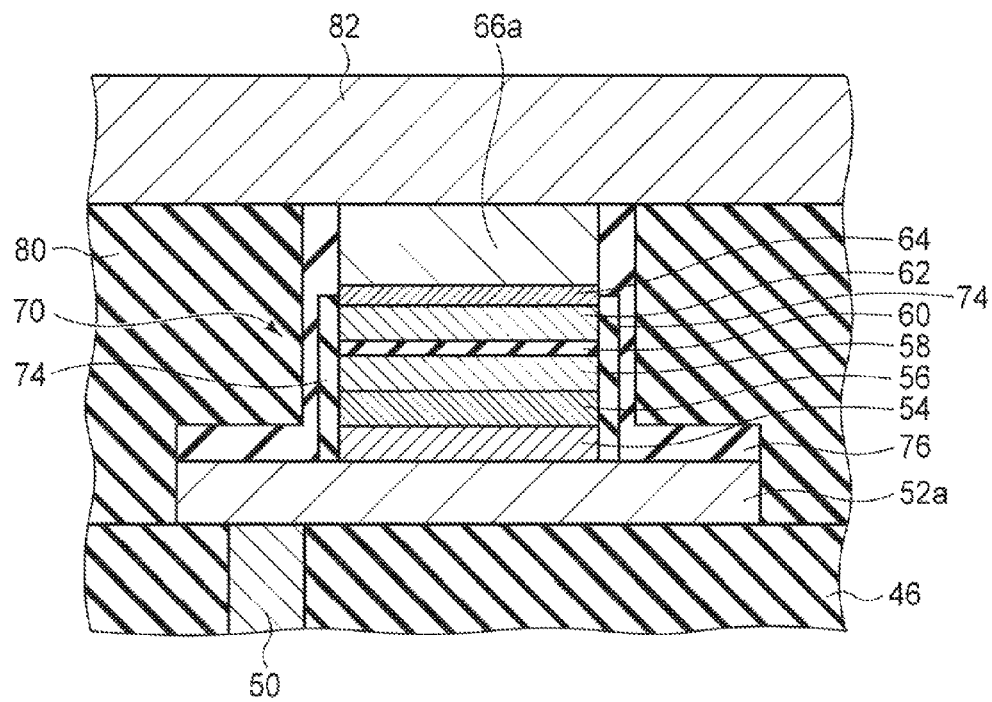
Figure 21A:
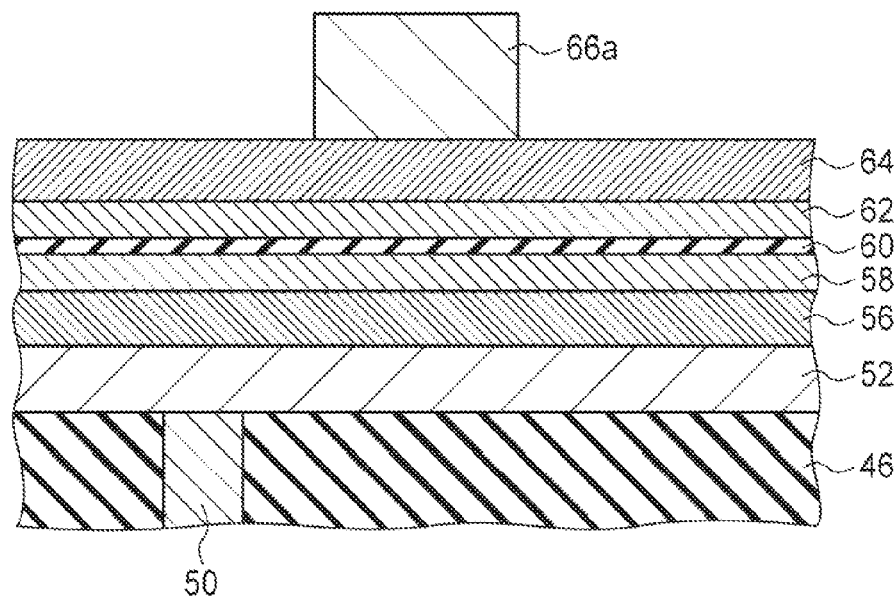
FIGS. 21A and 21B are sectional views illustrating a method of manufacturing a magnetic memory device according to a reference example.
Figure 21B:
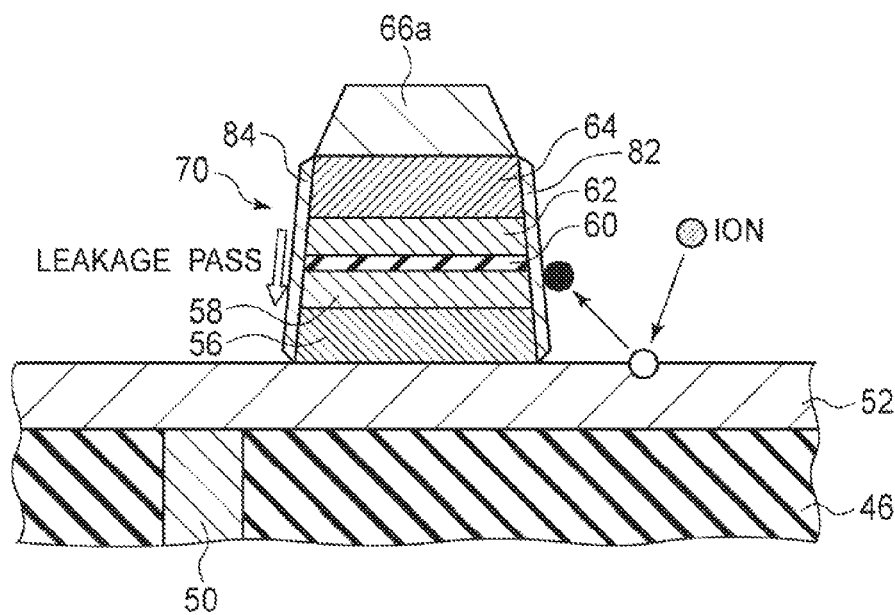

Next, e.g., an Al film of a 500 nm-thickness is formed above the entire surface by, e.g., sputtering method to form an interconnection metal layer 82 of the Al film (FIG. 20A).

Figure 13:
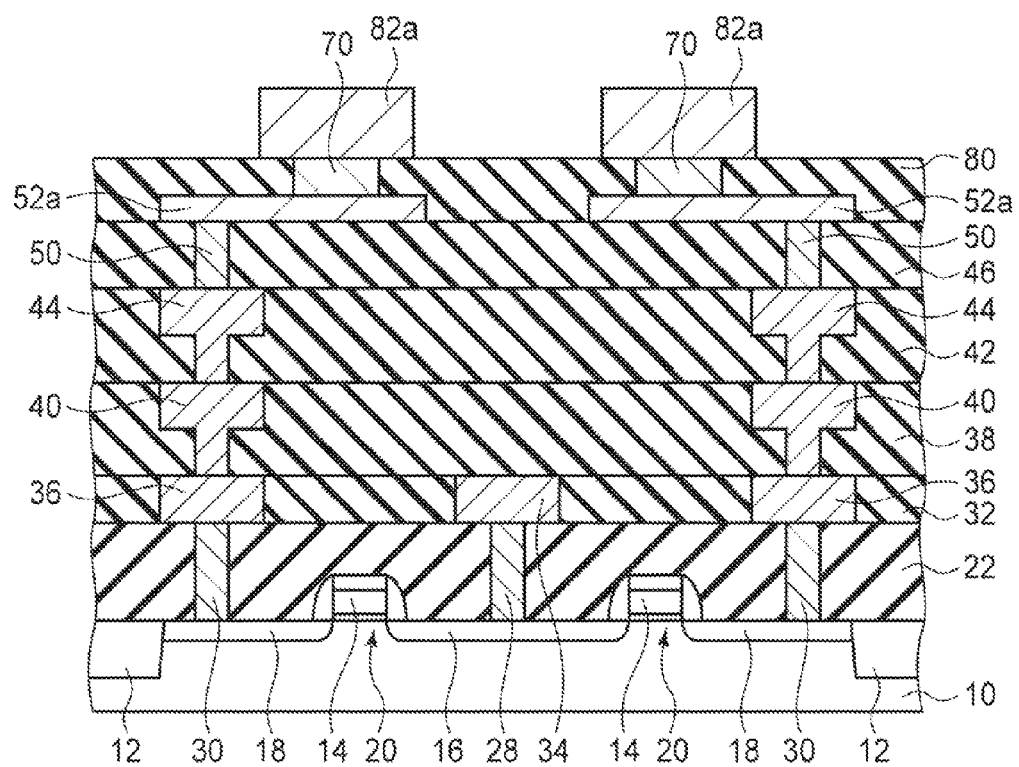
Figure 20B:
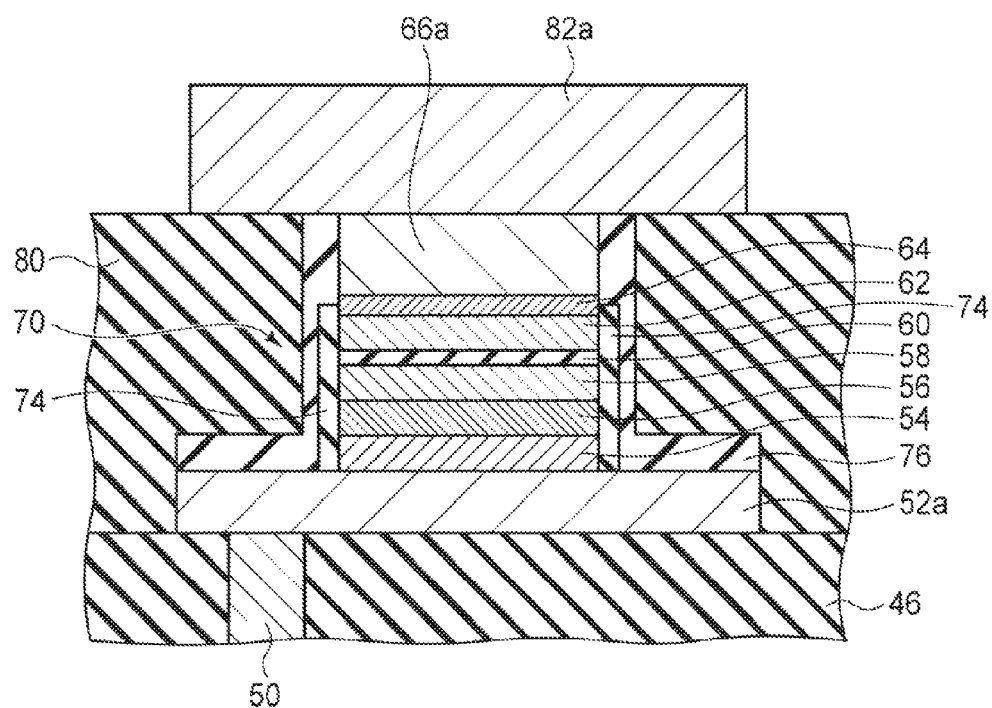

Next, the interconnection metal layer 82 is patterned by photolithography and dry etching to form the bit line 82a connected to the upper electrode 66a (FIG. 20B, FIG. 13).

Hereafter, upper level interconnection layers and a passivation layer, etc. are formed as required, and the magnetic memory device according to the present embodiment is completed.

Next, the function of the metal layer 54 formed between the lower electrode layer 52 and the antiferromagnetic layer 56 will be described again.

It is also considered to form the antiferromagnetic layer 56 directly on the lower electrode layer 62. In this case, the sectional structure in the step corresponding to FIG. 15B is as illustrated in FIG. 21A. Then, dry etching is made with the upper electrode 66a as the hard mask, and the sectional structure with the cap layer 64, the ferromagnetic layer 62, the tunnel insulating film 60, the ferromagnetic layer 58 and the antiferromagnetic layer 56 patterned is as illustrated in FIG. 21B.

The ferromagnetic layer 62, the ferromagnetic layer 58 and the antiferromagnetic layer 56 are formed of magnetic materials as the main materials, which do not easily form compounds of high vapor pressures. Accordingly, it is difficult to process the ferromagnetic layer 62, the ferromagnetic layer 58 and the antiferromagnetic layer 56 by reactive ion etching. The ferromagnetic layer 62, the ferromagnetic layer 58 and the antiferromagnetic layer 56 are patterned mainly by physical etching mainly based on ion milling.

When the ferromagnetic layer 62, the tunnel insulating film 60, the ferromagnetic layer 58 and the antiferromagnetic layer 56 are patterned by ion milling, the resputtered magnetic material adheres to the side walls of the magnetoresistive effect element 70 (the resputtered film 84 in the drawing). Especially, when the resputtered film 84 adheres to the side wall of the tunnel insulating film 60, the resputtered film 84 becomes a leakage path between the ferromagnetic layers 58, 62, and the magnetoresistive effect element 70 does not normally operate.

After the dry etching, to remove the etching residue, etc., wet cleaning processing is often made. However, when the tunnel insulating film 60 is formed of a deliquescent material, such as MgO or others, the tunnel insulating film 60 is degraded by the wet cleaning processing, and often the magnetoresistive effect element does not normally operate.

In the method of manufacturing the magnetic memory device according to the present embodiment, however, the metal layer 54 is formed between the lower electrode layer 52 and the antiferromagnetic layer 56.

In the present embodiment as well, when the ferromagnetic layer 62, the tunnel insulating film 60, the ferromagnetic layer 58 and the antiferromagnetic layer 56 are patterned by ion milling, the resputtered magnetic materials adhere to the side walls of the magnetoresistive effect element 70.

However, in the ion milling process, the formation of the resputtered film on the side walls of the magnetoresistive effect element 70, and the etching simultaneously advances, whereby the resputtered film adhered to the side walls of the magnetoresistive effect element 70 is removed in the process of etching the metal layer 54. Instead, on the side walls of the magnetoresistive effect element 70, the sidewall metal layer 72 is formed by resputtering from the metal layer 54.

As described above, the metal layer 54 can be etched selectively to the lower electrode layer 52. By this selective etching, the metal layer 54 is uniformly etched down to the interface between the metal layer 54 and the lower electrode layer 52, whereby the sidewall metal layer 72 of a film thickness which is uniform in the wafer plane can be formed on the side walls of the magnetoresistive effect element 70. The film thickness of the metal layer 54 is suitably set, whereby the sidewall metal layer 72 of a sufficient film thickness for protecting the magnetoresistive effect element 70 can be formed on the side walls of the magnetoresistive effect element 70.

Hereafter, the sidewall metal oxide layer 74 is formed by oxidizing the sidewall metal layer 72, whereby the short circuit between the ferromagnetic layers 58, 62 is solved. The side walls of the magnetoresistive effect element 70 are protected by the sidewall metal oxide layer 74. Thus, the degradation of the tunnel insulating film 60 can be prevented in the wet cleaning processing after the dry etching.

Because of the film thickness of the sidewall metal layer 78, which is uniform in the wafer plane, the in-wafer plane fluctuations of the oxidation conditions necessary for completely replacing the sidewall metal layer 72 by the sidewall metal oxide layer 74 is decreased. Thus, the sidewall metal oxide layer 74 can be easily formed in the entire surface of the wafer. The film thickness of the formed sidewall metal oxide layer 74 can be also made uniform in the wafer plane.

Thus, according to the manufacturing method according to the present embodiment, the degradation of the characteristics of the magnetoresistive effect element 70 due to the sputtering of the ion milling and the wet cleaning processing can be prevented. The sidewall metal oxide layer 74 can be formed in a prescribed film thickness uniform in plane and can be used as a protection film having stable characteristics.

As described above, according to the present embodiment, in patterning the magnetoresistive effect element, on the side walls of the magnetoresistive effect element, the sidewall metal layer is positively formed of the resputtered particles from the metal layer, and the sidewall metal layer is oxidized to be an insulator, whereby the short circuit via the side walls can be prevented.

The metal layer is etched selectively to the lower electrode, whereby the in-pane uniformity of the film thickness of the sidewall metal layer can be improved. Thus, the in-plane uniformity of the film thickness of the sidewall metal oxide layer can be also improved, and the sidewall metal oxide layer as the protection film can be formed stable on the side walls of the magnetoresistive effect element.

The side walls of the magnetoresistive effect element is covered by the sidewall metal layer or the sidewall metal oxide layer, whereby even when the tunnel insulating film has low resistance to the wet processing, the wet cleaning can be made without degrading the characteristics of the magnetoresistive effect element.

The above-described embodiment can cover other various modifications.

For example, in the above-described embodiment, the ferromagnetic layer 58 as the pinned magnetization layer, and the ferromagnetic layer 62 as the free magnetization layer are formed respectively of a single ferromagnetic layer, but either or both of them may have a layer structure. For example, the layer film of a ferromagnetic material, e.g., CoFe/NiFe, or others may be used. Otherwise, the layer film structure including a plurality of antiferromagnetic exchange coupled ferromagnetic layers may be used. Such layer structure can be the structure of ferromagnetic layers stacked with nonmagnetic layer formed therebetween, e.g., a layer structure of CoFeB/Ru/CoFeB or others.

Figure 22:
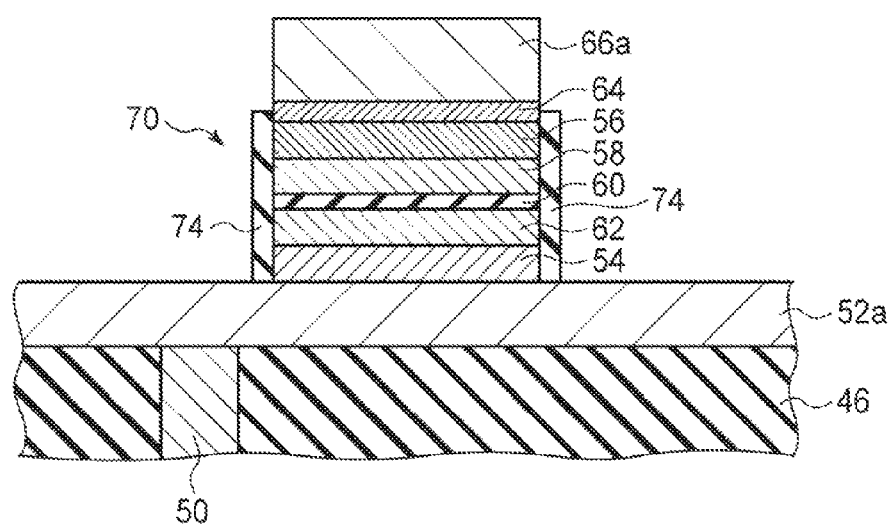
FIG. 22 is a diagrammatic sectional view illustrating a structure of a magnetic memory device according to a modification of the embodiment.

In the above-described embodiment, the so-called bottom pin type magnetoresistive effect element having the free magnetization layer (the ferromagnetic layer 62) formed above the pinned magnetization layer (the ferromagnetic layer 58) with the tunnel insulating film 60 formed therebetween is used. However, the bottom pin-type is not essential, and as exemplified in FIG. 22, the top pin type magnetoresistive effect element 70 having the metal layer 54, the ferromagnetic layer 62 as the free magnetization layer, the tunnel insulating film 60, the ferromagnetic layer 58 as the pinned magnetization layer, the antiferromagnetic layer 56, the cap layer 64 and the upper electrode 66a sequentially stacked above the lower electrode 52a may be used.

In the above-described embodiment, the MTJ element of the exchange coupling type spin valve structure having the magnetization direction of the ferromagnetic layer 58 pinned by the antiferromagnetic layer 56 is used, but an MTJ element of the pseudo-spin valve structure using no antiferromagnetic layer may be used.

In the above-described embodiment, the magnetoresistive effect element is formed above the third level metal interconnection layer, but this is not essential. The magnetoresistive effect element may be formed above a layer upper of the fourth level metal interconnection layer or a layer below the third level metal interconnection layer.

In the above-described embodiment, the magnetic memory device including 1T-1MTJ memory cells is used. However, the structure of the memory cells is not limited to 1T-1MTJ, and magnetic memory including 1T-2MTJ memory cells or 2T-2MTJ memory cells can be used.

In the above-described embodiment, the magnetoresistive effect element is used in the magnetic memory device, but the magnetoresistive effect element described in the above-described embodiment may be used in, e.g., a magnetic head.

The structure, the constituent materials, the manufacturing conditions, etc. of the magnetic memory device described in the above-described embodiment are only one example and can be suitably modified or changed in accordance with the technical common senses of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a magnetoresistive effect element comprising:

forming a first electrode above a substrate;

forming a metal layer of a metal material above the first electrode;

forming a first magnetic layer above the metal layer;

forming a tunnel insulating film above the first magnetic layer;

forming a second magnetic layer above the tunnel insulating film;

forming a second electrode layer above the second magnetic layer;

patterning the second electrode layer;

patterning the second magnetic layer, the tunnel insulating film, the first magnetic layer and the metal layer, while depositing sputtered particles of the metal layer on side walls of the second magnetic layer, the tunnel insulating film, the first magnetic layer and the metal layer to form a sidewall metal layer; and oxidizing the sidewall metal layer to form an insulative sidewall metal oxide layer.

2. The method of manufacturing a magnetoresistive effect element according to claim 1, wherein in patterning the second magnetic layer, the tunnel insulating film, the first magnetic layer and the metal layer, the metal layer is etched selectively to the first electrode.

3. The method of manufacturing a magnetoresistive effect element according to claim 2, wherein in patterning the second magnetic layer, the tunnel insulating film, the first magnetic layer and the metal layer, $CH_3OH$, HCOH, HCOOH or a mixed gas of CO and $NH_3$ is used as an etching gas.

4. The method of manufacturing a magnetoresistive effect element according to claim 1, wherein in oxidizing the sidewall metal layer, the sidewall metal layer is exposed to a plasma containing oxygen to oxidize the sidewall metal layer.

5. The method of manufacturing a magnetoresistive effect element according to claim 4, wherein in oxidizing the sidewall metal layer, the sidewall metal layer is exposed to the plasma of $O_2$, $CO_2$, or a gas of $O_2$ or $CO_2$ diluted with $N_2$, Ar, CO or $CO_2$ to oxidize the sidewall metal layer.

6. The method of manufacturing a magnetoresistive effect element according to claim 4, wherein in oxidizing the sidewall metal layer, the sidewall metal layer is oxidized under a pressure of not more than 1 Torr.

7. The method of manufacturing a magnetoresistive effect element according to claim 1, wherein the metal material is aluminum, titanium, zirconium, vanadium, chrome or copper.

8. The method of manufacturing a magnetoresistive effect element according to claim 1, wherein the first electrode is formed of tantalum tungsten or hafnium.

9. The method of manufacturing a magnetoresistive effect element according to claim 1, further comprising after forming the sidewall metal layer, cleaning with a chemical solution.

* * * * *